United States Patent [19]

Kelzer

[11] Patent Number: 4,856,400

[45] Date of Patent: Aug. 15, 1989

[54] SCORING CUTTER

[76] Inventor: Robert A. Kelzer, 2111 E. Pinetree Blvd., Thomasville, Ga. 31792

[21] Appl. No.: 156,841

[22] Filed: Feb. 17, 1988

[51] Int. Cl.⁴ .............................................. B26D 3/08
[52] U.S. Cl. ....................................... 83/885; 83/347; 83/422; 83/431; 83/475
[58] Field of Search ................. 83/885, 886, 887, 884, 83/117, 348, 426, 430, 422, 475, 431, 347

[56] References Cited

U.S. PATENT DOCUMENTS

| | | | |
|---|---|---|---|
| 244,845 | 7/1881 | Bowles | 83/430 X |
| 1,825,223 | 9/1931 | Deck | 83/430 |
| 2,241,395 | 5/1941 | Egling | 83/430 |
| 2,683,208 | 7/1954 | Andrews | 83/886 X |
| 2,706,002 | 4/1955 | Whittamore | 83/885 |
| 4,220,272 | 9/1980 | Danti | 83/885 X |

FOREIGN PATENT DOCUMENTS 9523 11/1956 Fed. Rep. of Germany ........ 83/348
0014284 2/1977 Japan ..................................... 83/117

*Primary Examiner*—Frank T. Yost
*Assistant Examiner*—Eugenia A. Jones
*Attorney, Agent, or Firm*—Jones, Askew & Lunsford

[57] ABSTRACT

There is disclosed a scoring cutter for scoring printed circuit boards to a uniform thickness. The scoring cutter has top and bottom circular blades set to a gap and rotatable in opposite directions to each other. Resilient wheels, four in number, having diameters slightly larger than the blades, are mounted for rotation with respect to the blades, one on each side of each blade. A circuit board is fed between the blades, and the resilient wheels position the circuit board in the gap between the blades.

13 Claims, 3 Drawing Sheets

SCORING CUTTER

BACKGROUND OF THE INVENTION

This invention relates generally to a cutting and milling apparatus and more particularly concerns a scoring cutter which can score a printed circuit board on both sides to a uniform thickness with the score lines on each side being of equal depth.

In manufacturing electronic equipment, manufacturers in an effort to save labor costs have adopted automated machinery that inserts electronic components into printed circuit boards. As the sophistication and capital cost of such automatic component insertion machines increase, it is important that those machines be utilized at maximum efficiency. Particularly, the efficiency of such machines can be increased if, instead of processing a number of small printed circuit boards, the machine can process a lesser number of large printed circuit boards. Such increase in efficiency results from eliminating some of the lost time that occurs while introducing the printed circuit board without components into the machine and removing the printed circuit board with components from the machine.

In order to maximize the size of the circuit boards being processed, a single large printed circuit board can provide the circuitry and space for a number of smaller circuit boards thereon. Once the components have been inserted by the automatic insertion machine, the large circuit board is separated into the several smaller circuit boards. In order to separate the larger circuit board into smaller circuit boards after the parts have been inserted, score lines are cut on the large printed circuit board before the components are inserted so that the large circuit board can be broken apart and separated along the previously provided score lines.

In order to assure consistent and clean breakage of the printed circuit boards along the score lines, it is necessary that a uniform thickness of the board material exist between the score lines provided on each side of the printed circuit board. Conventionally, aligned score lines on each side of the printed circuit board have been produced by a single routing blade set a predetermined height above a guide surface. The printed circuit board, prior to insertion of components, was simply fed along the guide surface under the routing blade to route out a score line on one side. The printed circuit board was then turned over and fed along the guide surface under the blade to produce a matching score line on the other side. Because laminated printed circuit boards may vary in thickness as much as fifteen percent from the nominal thickness from one end of the board to the other, the variations in thickness produced a variation in the thickness of the remaining material between the score lines resulting in weak spots and strong spots which, when the boards were broken apart, caused inconsistent breakage along the score line.

SUMMARY OF THE INVENTION

It is therefore an object of the present invention to provide a scoring cutter for scoring a printed circuit board on both sides to a uniform thickness to assure uniformity of breakage along the score lines when printed circuit boards are separated after components have been inserted.

It is likewise an object of the present invention to provide a scoring cutter which can maintain uniform thickness of material between score lines while varying the depth of the score lines on either side of the board.

It is also an object of the present invention to provide a scoring cutter which retains the board between the cutting blades in a stable fashion so that the cutting blades provide smooth finished score lines.

It is also an object of the present invention to provide a scoring cutter which protects the surface of the board adjacent the scoring lines from damage or abrasion during the scoring process.

The foregoing objects are attained by a scoring cutter which has a first and second circular cutting blade each mounted on a shaft for counter-rotation with respect to each other. The circular cutting blades are aligned and spaced from each other to define a predetermined gap. A pair of resilient wheels are mounted one on either side of each cutting blade for rotation relative to the cutting blades. The resilient wheels have a slightly greater diameter than the diameter of the cutting blades so that, when the scoring cutter is not in use, the cutting blade remains recessed in the space between the two resilient wheels. A circuit board to be scored is fed into the gap between the two cutting blades.

The resilient wheels consist of a concentric inner ring and outer ring which are connected together by means of elastic rubber web of spokes. Consequently, the outer ring can move radially with respect to the inner ring as the spokes on the opposite side from the gap are stretched. A rubber cover is provided on the outer surface of the outer ring in order to protect the circuit board from damage and abrasion while it is being fed through the gap of the scoring cutter.

The resilient wheels (four in number) surrounding both cutting blades position the printed circuit board in the gap between the two cutting blades. The cutting blades cut score lines on each side of the circuit board as it is fed between them. The gap between the cutting blades is fixed which in turn produces a uniform thickness of material on the circuit board between the score lines.

If the four resilient wheels are essentially identical and the blades are of the same diameter, the circuit board will be centered in the gap, and the depth of the score lines on each side will be equal. The depth of scoring for each side can be varied by varying the diameter of the wheels or blade on one side or the other or by varying the resilience of the wheels on one side or the other.

Other objects and advantages of the present invention will become apparent upon reading the following detailed description and upon reference to the drawings.

DETAILED DESCRIPTION OF THE INVENTION

While the invention will be described in connection with a preferred embodiment, it will be understood that I do not intend to limit the invention to that embodiment. On the contrary, I intend to cover all alternatives, modifications, and equivalents as may be included within the spirit and scope of the invention as defined by the appended claims.

Figure 1:
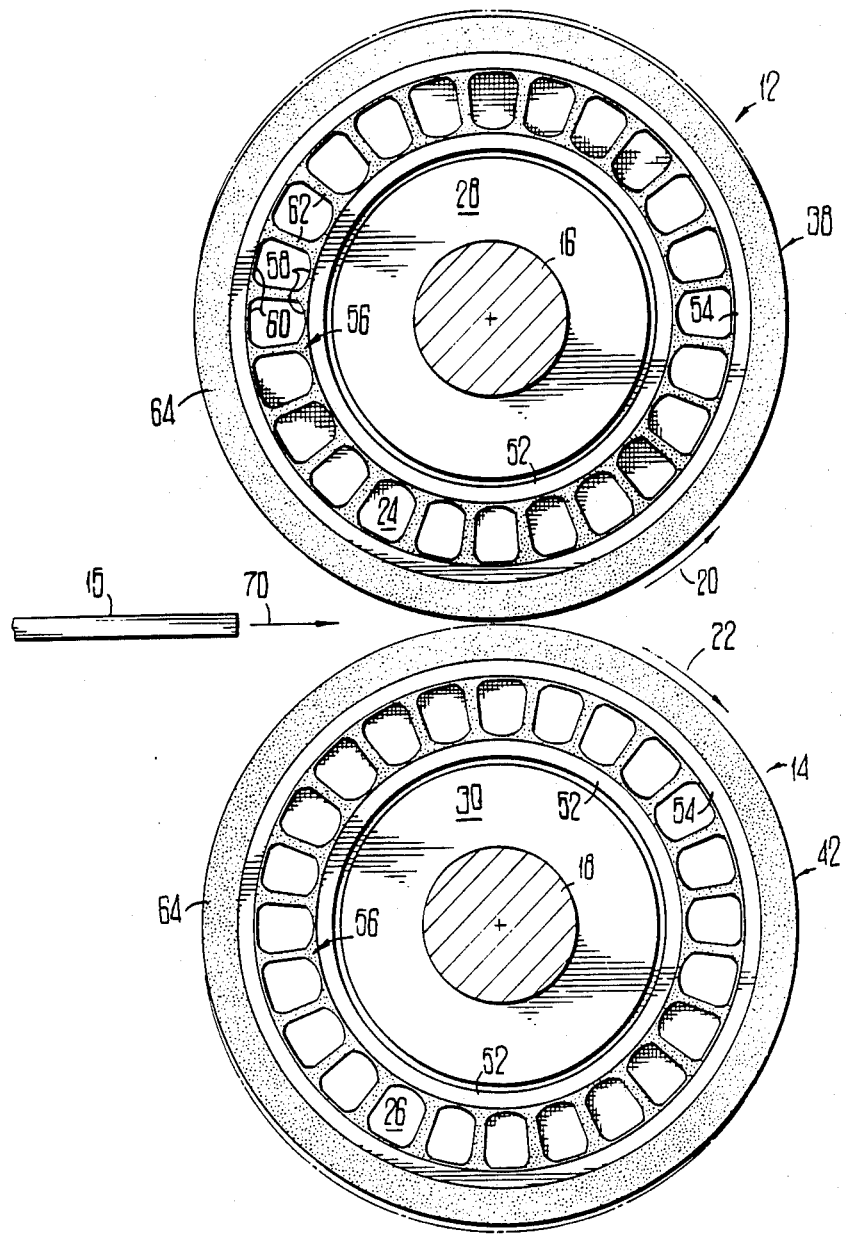
FIG. 1 is a side elevation view of the scoring cutter in its idle condition.
Figure 3:
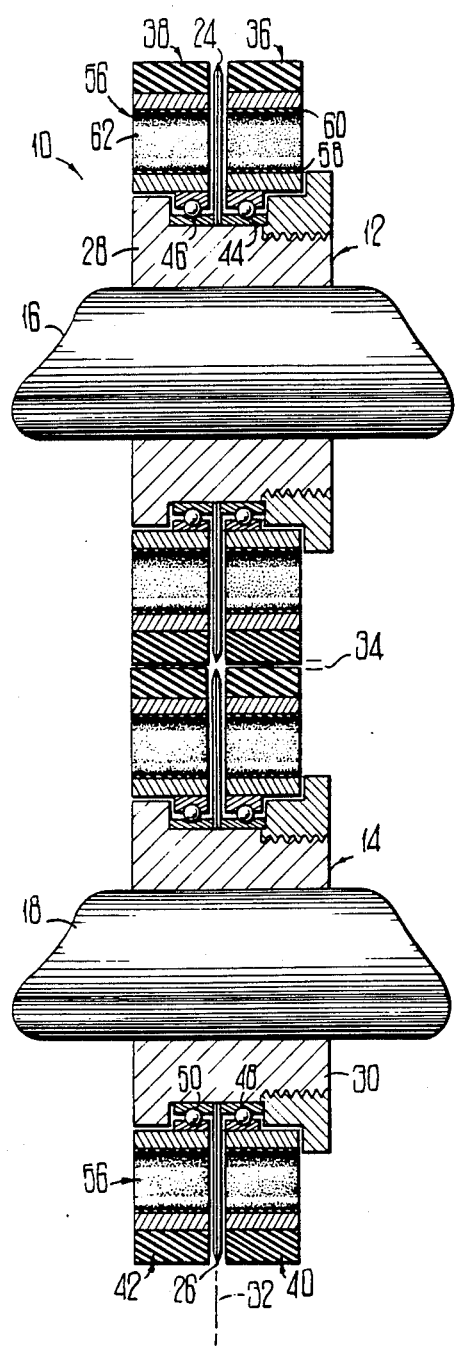
FIG. 3 is a cross-section view as seen along line 3—3 of FIG. 1.

Turning to FIGS. 1 and 3, there is shown a scoring cutter 10 comprising a first upper cutting means 12 and a second lower cutting means 14 for cutting aligned score lines on both sides of a circuit board 15. The upper cutting means 12 and the lower cutting means 14 are identical. The cutting means 12 and 14 include shafts 16 and 18 respectively which are mounted for rotation on bearings (not shown) and driven by a suitable source of rotational energy. The shafts 16 and 18 rotate in opposite directions with respect to each other as shown by the arrows 20 and 22 shown in FIG. 1. Each cutting means 12 and 14 includes respectively circular blades 24 and 26 fixed to the shafts 16 and 18 by means of arbors 28 and 30. The shafts 16 and 18 are mounted so that the blades 24 and 26 are aligned along a line 32 (FIG. 1). In addition, the blades 24 and 26 are spaced apart to define a gap 34 where the blades pass in closest proximity. For scoring circuit boards, the cutting blades are either diamond or solid carbide. In addition, while a V-shaped blade is shown, the blade could also be shaped to provide any other desired cross section for the resulting score line such as a square channel, an arc of a circle or ellipse, or the like.

Cutting means 12 and 14 include a pair of resilient wheels--resilient wheels 36 and 38 for cutting means 12 and resilient wheels 40 and 42 for cutting means 14. The resilient wheels, which will be described in greater detail below, are mounted one on either side of the cutting blades and rotate relative to the cutting blades. Particularly, resilient wheels 36 and 38 of cutting means 12 are mounted by means of roller bearings 44 and 46 on the arbor 28 of the first cutting means so that the resilient wheels 36 and 38 can rotate relative to the rotation of the circular cutting blade 24. Likewise, the resilient wheels 40 and 42 of cutting means 14 are mounted one on either side of the cutting blade 26 by means of roller bearings 48 and 50 on arbor 30. Resilient wheels 40 and 42 can therefore rotate relative to the rotation of circular cutting blade 26. As can be seen in FIG. 3, the diameters of the resilient wheels are greater than the diameters of the cutting blades so that in the idle condition the cutting blades are recessed between the resilient wheels.

Returning to FIG. 1, there is shown in greater detail the resilient wheels 38 and 42 of cutting means 12 and 14 respectively. The resilient wheels 36, 38, 40, and 42 are in all respects identical. Therefore, the description of resilient wheel 38 shown in FIG. 1 will suffice to describe the other three resilient wheels. Resilient wheel 38 comprises an inner steel ring 52 and a concentric outer steel ring 54. The inner steel ring 52 is pressed fit onto the outer shell of roller bearing 46 so that resilient wheel 38 can rotate relative to the arbor 28. The steel rings 52 and 54 are connected together by means of a elastic web 56 consisting of an inner elastic ring 58, outer elastic ring 60, and twenty-four connecting spokes 62. Each of the twenty-four spokes are of the same crosssectional configuration so that the two steel rings 52 and 54 can move relative to each other in a radial direction by the consistent stretching of the spokes 62. The outer steel ring 54 is covered by a surface layer 64 of rubber to protect the circuit board 15 that come into contact with the resilient wheels during the process of scoring the circuit board 15.

The steel rings 52 and 54 are preferably cold rolled steel conforming to S.A.E. Specification 1018. The rubber web 56 is preferably Buna-N (black) which is sold by Burton Rubber Co. of Burton, Ohio and which has a Shore A Durometer hardness of 65 as measured by ASTM D2240-81 and an elongation of 800 percent.

Figure 2:
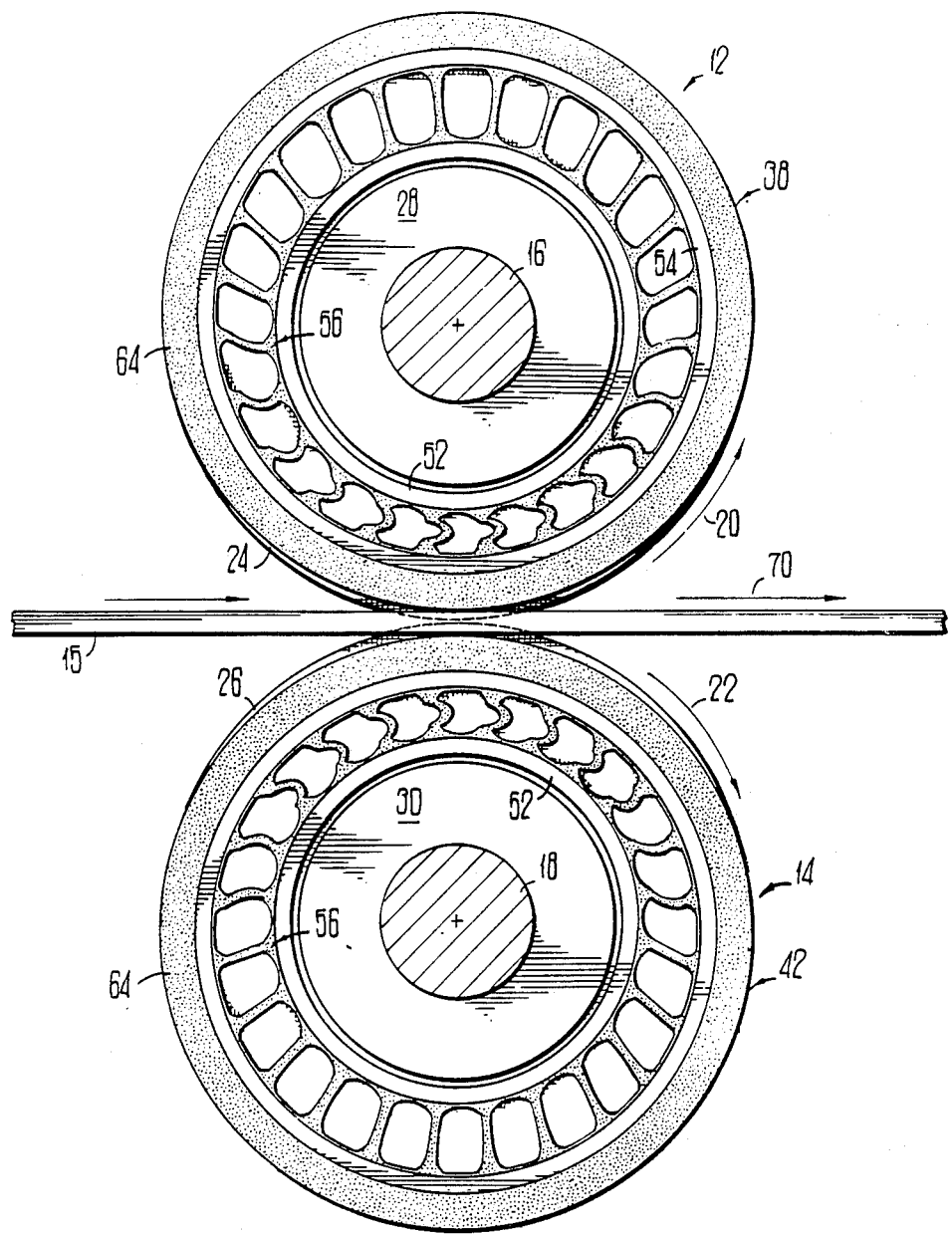
FIG. 2 is a side elevation view of the scoring cutter while a circuit board is being scored.
Figure 4:
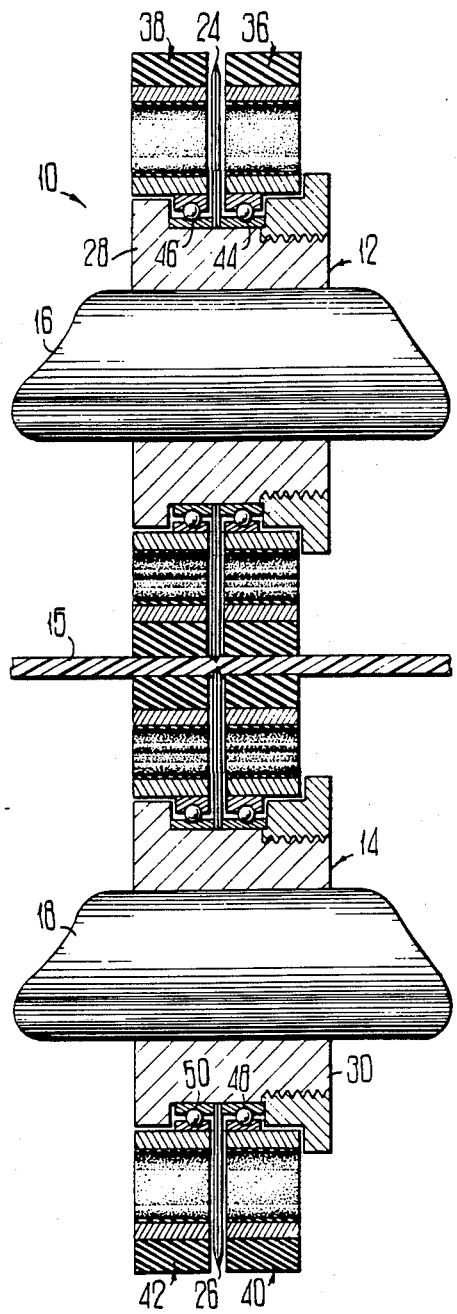
FIG. 4 is a cross-section view as seen along line 4—4 of FIG. 2.

FIGS. 2 and 4 show the scoring cutter 10 in the process of scoring the circuit board 15. The circuit board may have nominal thicknesses between 0.040 and 0.070 inch, and each board may vary as much as 15 percent from its nominal thickness. The cutting blades 24 and 26 each have a diameter of 4.010 inches, and the resilient wheels each have an outside diameter of 4.050 inches. Consequently, in the idle condition (FIGS. 1 and 3), the blades are recessed between the resilient wheels at a depth of 0.020 inch. The gap 34 between the blades is set to provide a space that is equal to about 40 percent of the nominal thickness of the circuit board 15 being processed. For a nominal board thickness of 0.050 inch, the gap would be (0.050 inch × 0.4) 0.020 inch, and that gap dimension would also be the uniform thickness of the remaining board material between the top and bottom score lines. With a gap of 0.020 inch for a 0.050 thick circuit board, the depth of the top and bottom score lines will each be 0.015 inch.

During scoring, the circuit board 15 with a nominal thickness of 0.050 inches is fed between the resilient wheels and the cutting blades at the gap 34. The circuit board forces the outer ring of the resilient wheels to move radially away from the gap to expose 0.015 inch of cutting blade on each side of the circuit board. When the resilient wheels have opened at the gap to accommodate the 0.050 inch thick circuit board, each wheel exerts approximately 25 lbs. force on the board. Because the resilient wheels are identical and the blade diameters are the same, the circuit board is centered in the gap 34 and held firmly against chatter.

The cutting blades rotate in opposite directions (arrows 20 and 22) at a speed of 800 rpm (a tangential speed of 209 ft/min for a blade with a diameter of 4.01 inches), and the circuit board 15 is fed into the gap at 20 feet per minute in the direction of the arrow 70. The saw dust and debris can escape through the open spokes 62 of the web 56. As a result of the stabilizing pressure of the resilient wheels and the differential between the linear speed of the blades and the feed speed, clean, uniform scoring is achieved.

It should be appreciated that as the circuit board thickness varies from nominal, the thickness of the material between the score lines remains constant and equal to the width of the gap 34 while the depth of the score lines on each side vary but remain equal in depth to each other. The depth of the score lines may be varied with respect to each other while retaining a constant gap and thickness of material between the score lines. The depth of score lines may be varied from side to side by having blades of unequal diameter. Resilient wheels of unequal diameter on either side produce unequal score line depths on each side. Unequal resilience of the resilient wheels on either side of the circuit board also produces unequal depth of scoring from side to side.

I claim:

1. A scoring cutter for scoring a board to a uniform thickness comprising first and second cutting means aligned and spaced apart a predetermined distance to define a gap wherein:
    (a) the first cutting means comprises:
        (i) a first circular cutting blade having a first blade diameter and fixed to a first shaft for rotation therewith; and (ii) a first pair of resilient wheels having a common first wheel diameter and a common first resilience, each mounted one on either side of the first cutting blade for rotation relative to the first cutting blade, wherein the first wheel diameter is equal to or greater than the first blade diameter, (b) the second cutting means comprises:

(i) a second circular cutting blade having a second blade diameter and fixed to a second shaft for rotation therewith; and (ii) a second pair of resilient wheels having a common second wheel diameter and a common second resilience, each mounted on either side of the second cutting blade for rotation relative to the second cutting blade, wherein the second wheel diameter is equal to or greater than the second blade diameter.

2. The scoring cuter of claim 1, wherein the resilient wheels each have an axis, an inner ring, and an outer ring which rings are concentric and are operatively interconnected to provide relative radial movement therebetween.

3. The scoring cutter of claim 2, wherein the rings are operatively interconnected by a number of evenly spaced elastic spokes each having an equal cross-sectional area.

4. The scoring cutter of claim 2, wherein the outer ring is covered with a protective surface.

5. The scoring cutter of claim 1, wherein the first and second blade diameters are equal, wherein the first and second resiliences are equal, and wherein the first and second wheel diameters are equal to produce scoring on each side of the board of equal depth.

6. The scoring cutter of claim 1, wherein the first and second blade diameters are equal, wherein the first and second resiliences are equal, and wherein the first and second wheel diameters are unequal to produce scoring on each side of the board of unequal depth.

7. The scoring cutter of claim 1, wherein the first and second blade diameters are equal, wherein the first and second resiliences are unequal, and wherein the first and second wheel diameters are equal to produce scoring on each side of the board of unequal depth.

8. The scoring cutter of claim 1, wherein the first and second blade diameters are equal, wherein the first and second resiliences are unequal, and wherein the first and second wheel diameters are unequal to produce scoring on each side of the board of unequal depth.

9. The scoring cutter of claim 1, wherein the first and second blade diameters are unequal, wherein the first and second resiliences are equal, and wherein the first and second wheel diameters are equal to produce scoring one each side of the board of unequal depth.

10. The scoring cutter of claim 1, wherein the first and second blade diameters are unequal, wherein the first and second resiliences are equal, and wherein the first and second wheel diameters are unequal to produce scoring on each side of the board of unequal depth.

11. The scoring cutter of claim 1, wherein the first and second blade diameters are unequal, wherein the first and second resiliences are unequal, and wherein the first and second wheel diameters are equal to produce scoring on each side of the board of unequal depth.

12. The scoring cutter of claim 1, wherein the first and second blade diameters are unequal, wherein the first and second resiliences are unequal, and wherein the first and second wheel diameters are unequal to produce scoring on each side of the board of unequal depth.

13. The scoring cutter of claim 1, wherein the first cutting blade and the second cutting blade rotate in opposite directions which produces a tangential blade speed and direction in the gap and wherein the scoring cutter further includes a feed means for feeding a board between the blades at a feed speed and in the same direction as the tangential blade direction and wherein the feed speed is less than the tangential blade speed.

* * * * *